United States Patent
Aisenbrey

(10) Patent No.: US 6,870,516 B2
(45) Date of Patent: Mar. 22, 2005

(54) LOW COST ANTENNAS USING CONDUCTIVE PLASTICS OR CONDUCTIVE COMPOSITES

(75) Inventor: Thomas Aisenbrey, Littleton, CO (US)

(73) Assignee: Integral Technologies, Inc., Bellingham, WA (US)

( * ) Notice: Subject to any disclaimer, the term of this patent is extended or adjusted under 35 U.S.C. 154(b) by 28 days.

(21) Appl. No.: 10/309,429

(22) Filed: Dec. 4, 2002

(65) Prior Publication Data

US 2004/0051666 A1 Mar. 18, 2004

Related U.S. Application Data

(63) Continuation-in-part of application No. 10/075,778, filed on Feb. 14, 2002.
(60) Provisional application No. 60/317,808, filed on Sep. 7, 2001, provisional application No. 60/269,414, filed on Feb. 16, 2001, and provisional application No. 60/317,808, filed on Feb. 15, 2001.

(51) Int. Cl.[7] .................................................. H01Q 1/38
(52) U.S. Cl. ...................... 343/873; 343/713; 343/793; 343/702
(58) Field of Search .......................... 343/702, 700 MS, 343/713, 793, 829, 846, 873, 912, 915

(56) References Cited

U.S. PATENT DOCUMENTS

| 3,587,098 A | * | 6/1971 | Gosnell ........................ 343/915 |
| 4,636,536 A | * | 1/1987 | Kamiyo et al. ............... 523/137 |
| 5,771,027 A | | 6/1998 | Marks et al. ................. 343/912 |
| 5,951,918 A | | 9/1999 | Kuwajima et al. ........... 252/514 |
| 6,147,662 A | | 11/2000 | Grabau et al. ............... 343/895 |
| 6,249,261 B1 | | 6/2001 | Solberg, Jr. et al. ......... 343/801 |
| 6,356,234 B1 | | 3/2002 | Harrison et al. ..... 343/700 MS |
| 6,479,143 B1 | * | 11/2002 | Tamaru et al. ............... 428/364 |
| 6,592,788 B1 | * | 7/2003 | Yamamoto et al. ........ 264/45.5 |

FOREIGN PATENT DOCUMENTS

| DE | 4227208 A1 | 1/1994 | .......... H01Q/21/28 |
| EP | 0862240 A1 | 9/1998 | ............ H01Q/9/30 |
| EP | 1024552 A2 | 8/2000 | .......... H01Q/21/30 |
| EP | 1233426 A2 | 8/2002 | ............ H01B/1/22 |
| JP | 06188629 | 7/1994 | .......... H01Q/23/00 |
| JP | 407008303 A | * 1/1995 | ............ A43B/7/36 |
| JP | 07162220 | 6/1995 | ............ H01Q/1/38 |

* cited by examiner

Primary Examiner—Tho Phan
(74) Attorney, Agent, or Firm—George O. Saile; Stephen B. Ackerman; Larry J. Prescott

(57) ABSTRACT

Low cost antennas formed of a conductive loaded resin-based material. The conductive loaded resin-based material comprises conductor fibers or conductor particles in a resin or plastic host wherein the ratio of the weight of the conductor fibers or conductor particles to the weight of the resin or plastic host is between about 0.20 and 0.40. The conductive fibers can be stainless steel, nickel, copper, silver, or the like. The antenna elements can be formed using methods such as injection molding or extrusion. Virtually any antenna fabricated by conventional means such as wire, strip-line, printed circuit boards, or the like can be fabricated using the conductive loaded resin-based materials. The conductive loaded resin-based material used to form the antenna elements can be in the form of a thin flexible woven fabric which can readily cut to the desired shape.

30 Claims, 8 Drawing Sheets

LOW COST ANTENNAS USING CONDUCTIVE PLASTICS OR CONDUCTIVE COMPOSITES

This patent application is a Continuation in Part of application Ser. No. 10/075,778, filed Feb. 14, 2002, which claimed priority to the following U.S. Provisional Patent Applications:
Ser. No. 60/317,808, filed on Sep. 7, 2001.
Ser. No. 60/269,414, filed on Feb. 16, 2001, and
Ser. No. 60/317,808, filed on Feb. 15, 2001.

BACKGROUND OF THE INVENTION (1) Field of the Invention

This invention relates to antennas formed of conductive loaded resin-based materials comprising micron conductive powders or micron conductive fibers.

(2) Description of the Related Art

Antennas are an essential part of electronic communication systems that contain wireless links. Low cost antennas offer significant advantages for these systems.

U.S. Pat. No. 5,771,027 to Marks et al. describes a composite antenna having a grid comprised of electrical conductors woven into the warp of a resin reinforced cloth forming one layer of a multi-layer laminate structure of an antenna.

U.S. Pat. No. 6,249,261 B1 to Solberg, Jr. et al. describes a direction-finding material constructed from polymer composite materials which are electrically conductive.

SUMMARY OF THE INVENTION

Antennas are essential in any electronic systems containing wireless links. Such applications as communications and navigation require reliable sensitive antennas. Antennas are typically fabricated from metal antenna elements in a wide variety of configurations. Lowering the cost of antenna materials or production costs in fabrication of antennas offers significant advantages for any applications utilizing antennas.

It is a principle objective of this invention to provide antennas fabricated from conductive loaded resin-based materials.

It is another principle objective of this invention to provide antennas having two antenna elements fabricated from conductive loaded resin-based materials.

It is another principle objective of this invention to provide antennas having an antenna element and a ground plane fabricated from conductive loaded resin-based materials.

It is another principle objective of this invention to provide a method of forming antennas from conductive loaded resin-based materials.

These objectives are achieved by fabricating the antenna elements and ground planes from conductive loaded resin-based materials. These materials are resins loaded with conductive materials to provide a resin-based material which is a conductor rather than an insulator. The resins provide the structural material which, when loaded with micron conductive powders or micron conductive fibers, become composites which are conductors rather than insulators.

Antenna elements are fabricated from the conductive loaded resins. Almost any type of antenna can be fabricated from the conductive loaded resin-based materials, such as dipole antennas, monopole antennas, planar antennas or the like. These antennas can be tuned to a desired frequency range.

The antennas can be molded or extruded to provide the desired shape. The conductive loaded resin-based materials can be cut, injection molded, over-molded, laminated, extruded, milled or the like to provide the desired antenna shape and size. The antenna characteristics depend on the composition of the conductive loaded resin-based materials, which can be adjusted to aid in achieving the desired antenna characteristics. Virtually any antenna fabricated by conventional means such as wire, strip-line, printed circuit boards, or the like can be fabricated using the conductive loaded resin-based materials.

DESCRIPTION OF THE PREFERRED EMBODIMENTS

Figure 1:
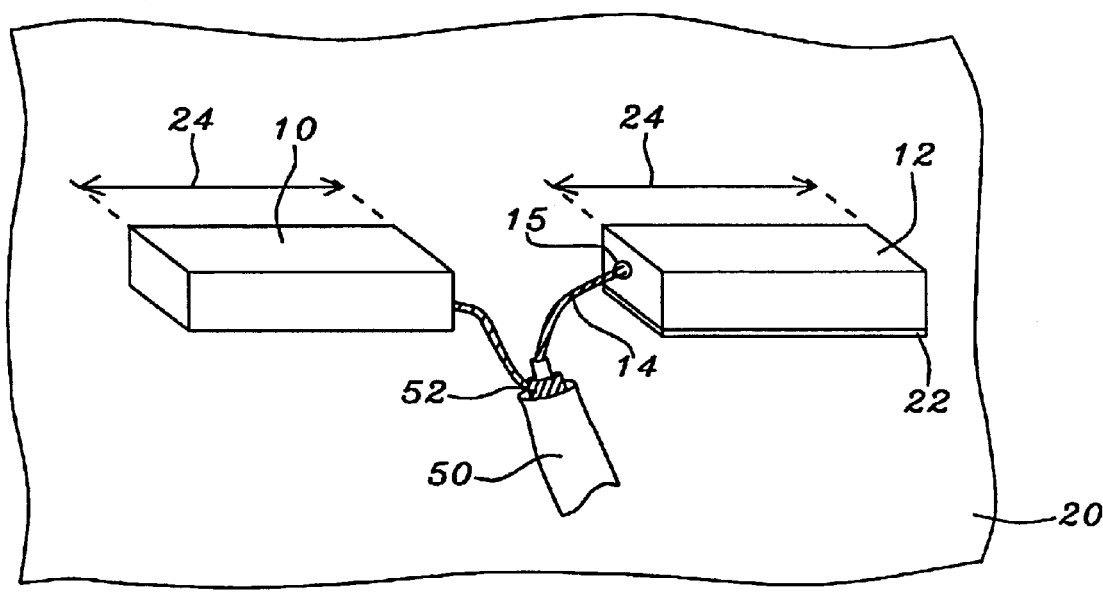
FIG. 1 shows a perspective view of a dipole antenna formed from a conductive loaded resin-based material.

The following embodiments are examples of antennas fabricated using conductive loaded resin-based materials. In some of the examples ground planes are also used and these ground planes can be formed of either conductive loaded resin-based materials or metals. The use of these conductive loaded resin-based materials in antenna fabrication significantly lowers the cost of materials and manufacturing processes used in the assembly antennas and the ease of forming these materials into the desired shapes. These materials can be used to form either receiving or transmitting antennas. The antennas and/or ground planes can be formed using methods such as injection molding, overmolding, or extrusion of the conductive loaded resin-based materials.

The conductive loaded resin-based materials typically but not exclusively have a conductivity of between about 5 and 25 ohms per square. The antenna elements, used to form the antennas, are formed of the conductive loaded resin-based materials and can be formed using methods such as injection molding, overmolding, or extrusion. The antenna elements can also be stamped to produce the desired shape. The conductive loaded resin-based material antenna elements can also cut or milled as desired.

The conductive loaded resin-based materials comprise micron conductive powders or fibers loaded in a structural resin. The micron conductive powders are formed of metals such as nickel, copper, silver or the like. The micron conductive fibers can be nickel plated carbon fiber, stainless steel fiber, copper fiber, silver fiber, or the like. The structural material is a material such as a polymer resin. Structural material can be, here given as examples and not as an exhaustive list, polymer resins produced by GE PLASTICS, Pittsfield, Mass., a range of other plastics produced by GE PLASTICS, Pittsfield, Mass., a range of other plastics produced by other manufacturers, silicones produced by GE SILICONES, Waterford, N.Y., or other flexible resin-based rubber compounds produced by other manufacturers. The resin-based structural material loaded with micron conductive powders or fibers can be molded, using a method such as injection molding, overmolding, or extruded to the desired shape. The conductive loaded resin-based materials can be cut or milled as desired to form the desired shape of the antenna elements. The composition of the composite materials can affect the antenna characteristics and must be properly controlled. The composite could also be in the family of polyesters with woven or webbed micron stainless steel fibers or other micron conductive fibers forming a cloth like material which, when properly designed in metal content and shape, can be used to realize a very high performance cloth antenna. Such a cloth antenna could be embedded in a persons clothing as well as in insulating materials such as rubber or plastic. The woven or webbed conductive cloths could also be laminated to materials such as Teflon, FR-4, or any resin-based hard material.

Refer now to FIGS. 1–10B for examples of antennas fabricated using conductive loaded resin-based materials. These antennas can be either receiving or transmitting antennas. FIG. 1 shows a perspective drawing of a dipole antenna with a radiating antenna element 12 and a counterpoise antenna element 10 formed from conductive loaded resin-based materials. The antenna comprises a radiating antenna element 12 and a counterpoise antenna element 10 each having a length 24 and a rectangular cross section perpendicular to the length 24. The length 24 is greater than three multiplied by the square root of the cross sectional area. The center conductor 14 of a coaxial cable 50 is electrically connected to the radiating antenna element 12 using a metal insert 15 formed in the radiating antenna element 12. The shield 52 of the coaxial cable 50 is connected to the counterpoise antenna element 10 using a metal insert formed in the counterpoise antenna element 10. The metal insert in the counterpoise antenna element 10 is not visible in FIG. 1 but is the same as the metal insert 15 in the radiating antenna element 12. The length 24 is a multiple of a quarter wavelength of the optimum frequency of detection or transmission of the antenna. The impedance of the antenna at resonance should be very nearly equal to the impedance of the coaxial cable 50 to assure maximum power transfer between cable and antenna.

Figure 3:
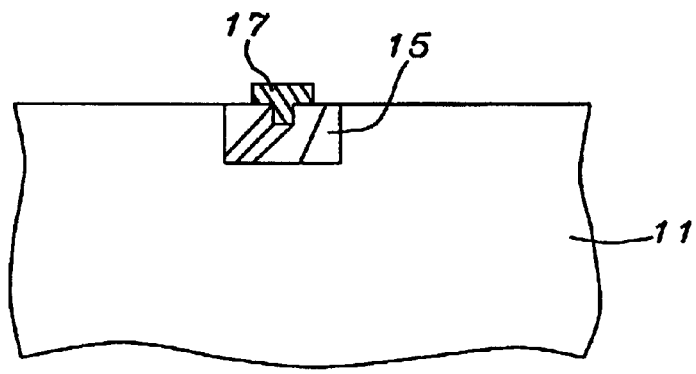
FIG. 3 shows a segment of an antenna element formed from a conductive loaded resin-based material showing a metal insert for connecting to conducting cable elements.

FIG. 3 shows a detailed view of a metal insert 15 formed in a segment 11 of an antenna element. The metal insert can be copper or other metal. A screw 17 can be used in the metal insert 15 to aid in electrical connections. Soldering or other electrical connection methods can also be used.

FIG. 1 shows an example of a dipole antenna with the radiating antenna element 12 placed on a layer of insulating material 22, which is placed on a ground plane 20, and the counterpoise antenna element 10 placed directly on the ground plane 20. The ground plane 20 is optional and if the ground plane is not used the layer of insulating material 22 may not be necessary. As another option the counterpoise antenna element 10 can also be placed on a layer of insulating material 22, see FIG. 2A. If the ground plane 20 is used it can also be formed of the conductive loaded resin-based materials.

Figure 2A:
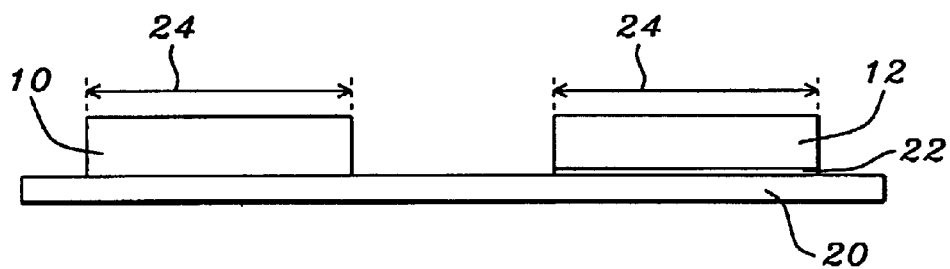
FIG. 2A shows a front view of the dipole antenna of FIG. 1 showing insulating material between the radiating antenna element and a ground plane.
Figure 2B:
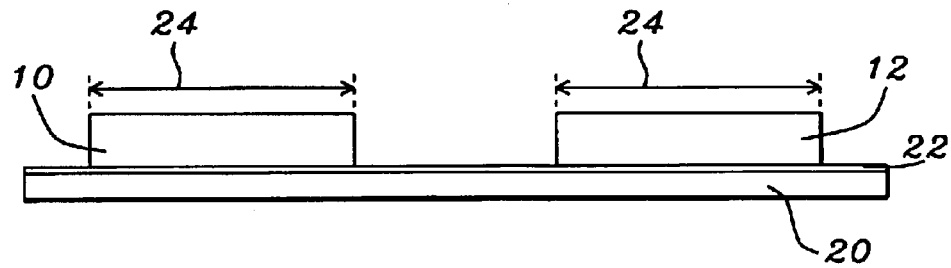
FIG. 2B shows a front view of the dipole antenna of FIG. 1 showing insulating material between both the radiating antenna element and the counterpoise antenna element and a ground plane.

FIG. 2A shows a front view of the dipole antenna of FIG. 1 for the example of an antenna using a ground plane 20, a layer of insulating material 22 between the radiating antenna element 12 and the ground plane 20, and the counterpoise antenna element 10 placed directly on the ground plane 20. FIG. 2B shows a front view of the dipole antenna of FIG. 1 for the example of an antenna using a ground plane 20 and a layer of insulating material 22 between both the radiating antenna element 12 and the counterpoise antenna element 10.

Figure 2C:
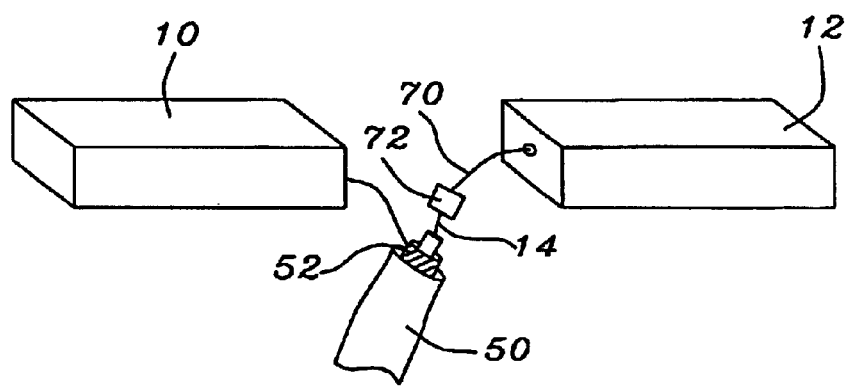
FIG. 2C shows an amplifier inserted between the radiating antenna element and the coaxial cable center conductor for the dipole antenna of FIG. 1.

As shown in FIG. 2C, an amplifier 72 can be inserted between the center conductor 14 of the coaxial cable and the radiating antenna element 12. A wire 70 connects metal insert 15 in the radiating antenna element 12 to the amplifier 72. For receiving antennas the input of the amplifier 72 is connected to the radiating antenna element 12 and the output of the amplifier 72 is connected to the center conductor 14 of the coaxial cable 50. For transmitting antennas the output of the amplifier 72 is connected to the radiating antenna element 12 and the input of the amplifier 72 is connected to the center conductor 14 of the coaxial cable 50.

In one example of this antenna the length 24 is about 1.5 inches with a square cross section of about 0.09 square inches. This antenna had a center frequency of about 900 MHz.

Figure 4A:
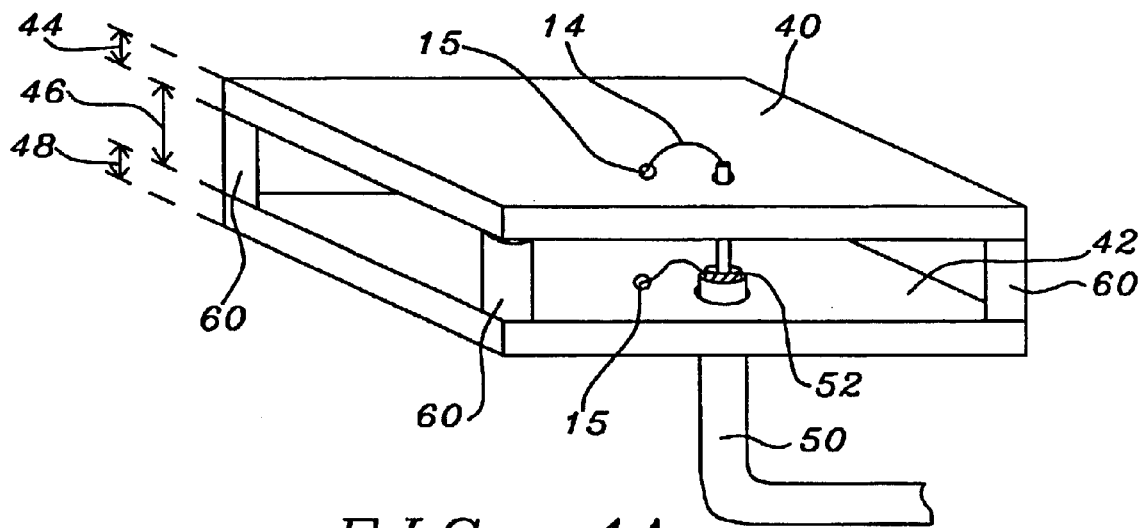
FIG. 4A shows a perspective view of a patch antenna comprising a radiating antenna element and a ground plane with the coaxial cable entering through the ground plane.
Figure 4B:
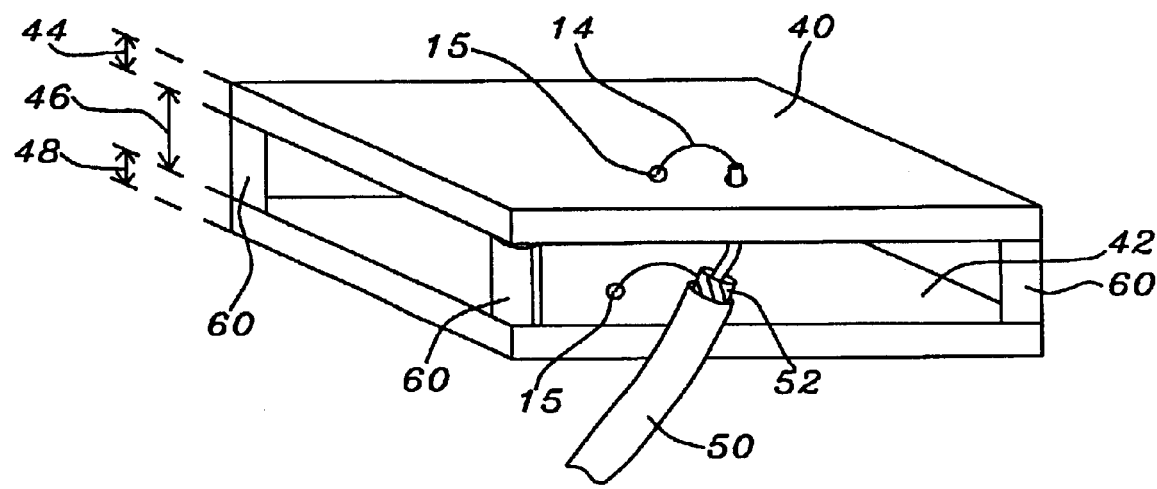
FIG. 4B shows a perspective view of a patch antenna comprising a radiating antenna element and a ground plane with the coaxial cable entering between the ground plane and the radiating antenna element.

FIGS. 4A and 4B show perspective views of a patch antenna with a radiating antenna element 40 and a ground plane 42 formed from conductive loaded resin-based materials. The antenna comprises a radiating antenna element 40 and a ground plane 42 each having the shape of a rectangular plate with a thickness 44 and a separation between the plates 46 provided by insulating standoffs 60. The square root of the area of the rectangular square plate forming the radiating antenna element 40 is greater than three multiplied by the thickness 44. In one example of this antenna wherein the rectangular plate is a square with sides of 1.4 inches and a thickness of 0.41 inches the patch antenna provided good performance at Global Position System, GPS, frequencies of about 1.5 GHz.

FIG. 4A shows an example of the patch antenna where the coaxial cable 50 enters through the ground plane 42. The coaxial cable shield 52 is connected to the ground plane 42 by means of a metal insert 15 in the ground plane. The coaxial cable center conductor 14 is connected to the radiating antenna element 40 by means of a metal insert 15 in the radiating antenna element 40. FIG. 4B shows an example of the patch antenna where the coaxial cable 50 enters between the radiating antenna element 40 and the ground plane 42. The coaxial cable shield 52 is connected to the ground plane 42 by means of a metal insert 15 in the ground plane 42. The coaxial cable center conductor 14 is connected to the radiating antenna element 40 by means of a metal insert 15 in the radiating antenna element 40.

Figure 5:
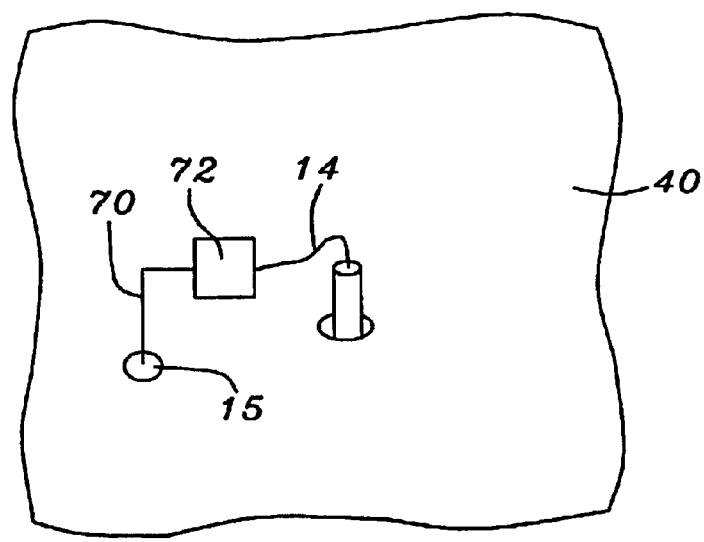
FIG. 5 shows an amplifier inserted between the radiating antenna element and the coaxial cable center conductor for the patch antenna of FIGS. 4A and 4B.

As shown in FIG. 5 an amplifier 72 can be inserted between the coaxial cable center conductor 14 and the radiating antenna element 40. A wire 70 connects the amplifier 72 to the metal insert 15 in the radiating antenna element 40. For receiving antennas the input of the amplifier 72 is connected to the radiating antenna element 40 and the output of the amplifier 72 is connected to the center conductor 14 of the coaxial cable 50. For transmitting antennas the output of the amplifier 72 is connected to the radiating antenna element 40 and the input of the amplifier 72 is connected to the center conductor 14 of the coaxial cable 50.

Figure 6:
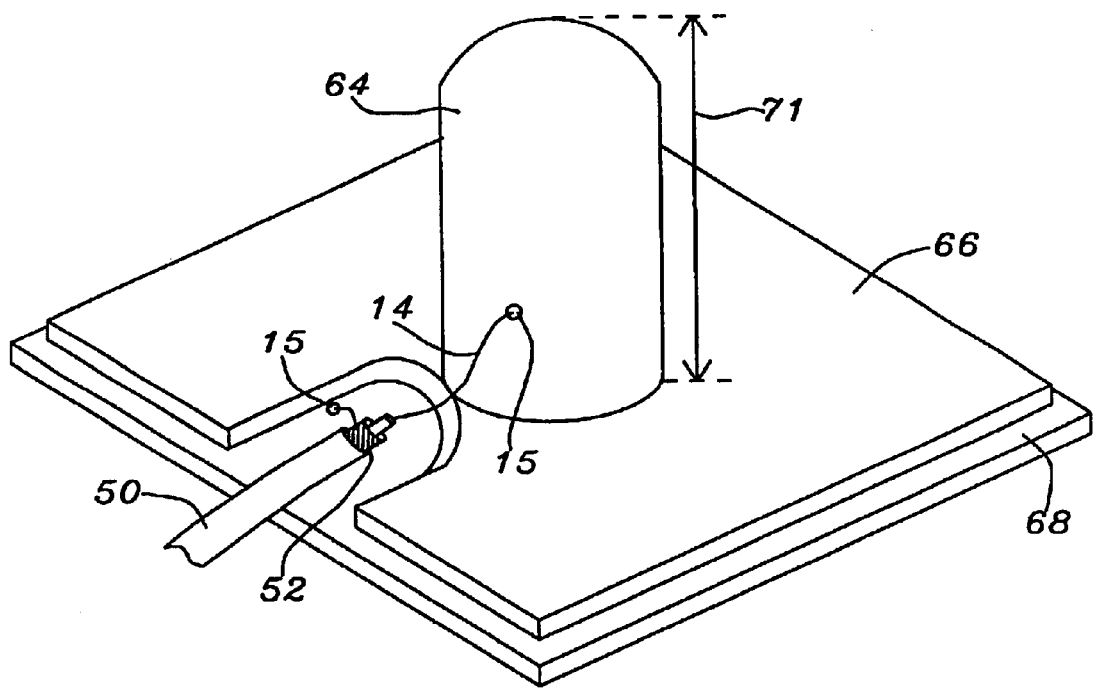
FIG. 6 shows a perspective view of a monopole antenna formed from a conductive loaded resin-based material.

FIG. 6 shows an example of a monopole antenna having a radiating antenna element 64, having a height 71, arranged perpendicular to a ground plane 68. The radiating antenna element 64 and the ground plane 68 are formed of conductive plastic or conductive composite materials. A layer of insulating material 66 separates the radiating antenna element 64 from the ground plane 68. The height 71 of the radiating antenna element 64 is greater than three times the square root of the cross sectional area of the radiating antenna element 64. An example of this antenna with a height 71 of 1.17 inches performed well at GPS frequencies of about 1.5 GHz.

Figure 7:
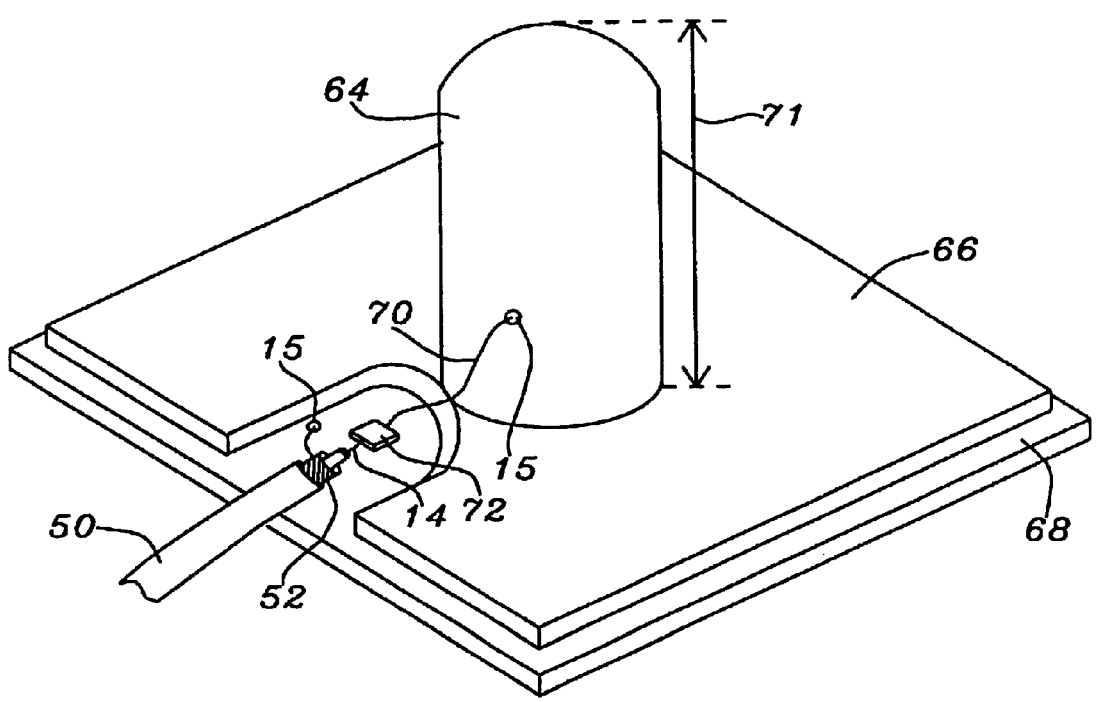
FIG. 7 shows a perspective view of a monopole antenna formed from a conductive loaded resin-based material with an amplifier between the radiating antenna element and the coaxial cable center conductor.

FIG. 7 shows an example of the monopole antenna described above with an amplifier 72 inserted between the center conductor 14 of the coaxial cable 50 and the radiating antenna element 64. For receiving antennas the input of the amplifier 72 is connected to the radiating antenna element 64 and the output of the amplifier 72 is connected to the center conductor 14 of the coaxial cable 50. For transmitting antennas the output of the amplifier 72 is connected to the radiating antenna element 64 and the input of the amplifier 72 is connected to the center conductor 14 of the coaxial cable 50.

Figure 8A:
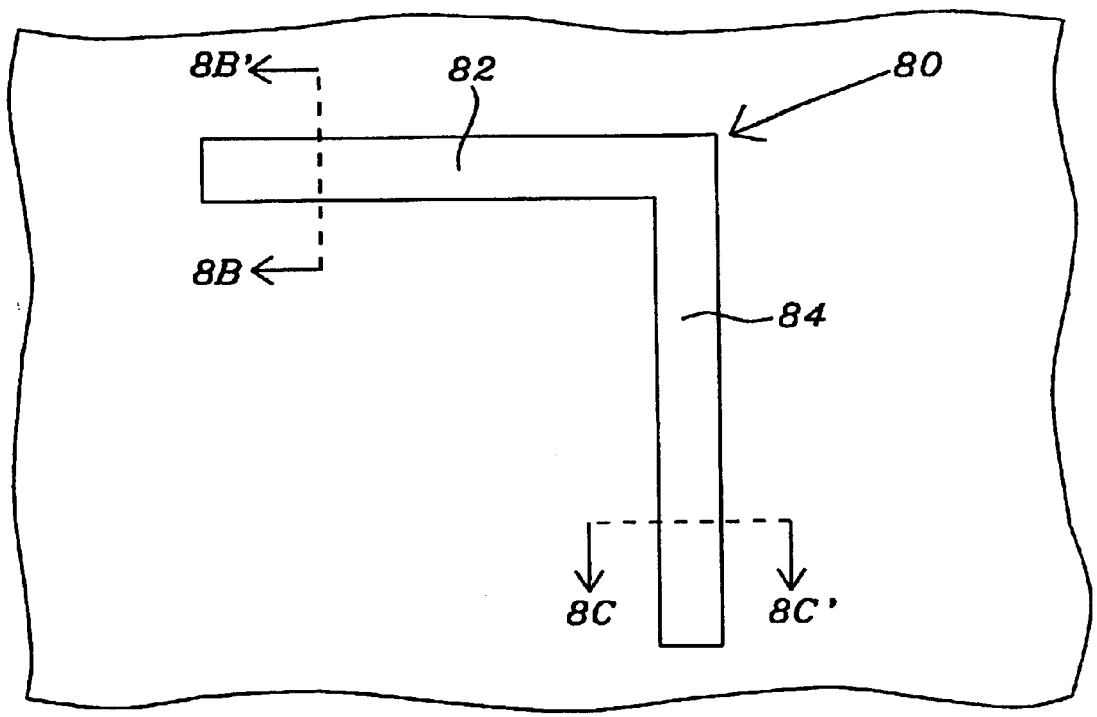
FIG. 8A shows a top view of an antenna having a single L shaped antenna element formed from a conductive loaded resin-based material.
Figure 8B:
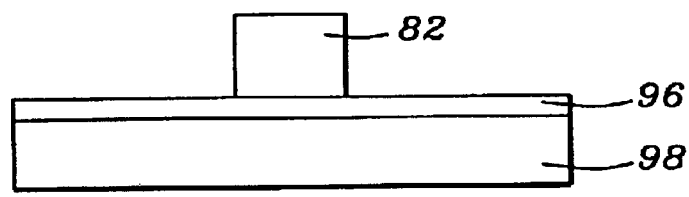
FIG. 8B shows a cross section view of the antenna element of FIG. 8A taken along line 8B–8B' of FIG. 8A.
Figure 8C:
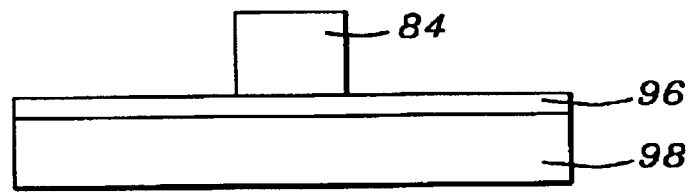
FIG. 8C shows a cross section view of the antenna element of FIG. 8A taken along line 8C–8C' of FIG. 8A.

FIGS. 8A, 8B, and 8C shows an example of an L shaped antenna having a radiating antenna element 80 over a ground plane 98. The radiating antenna element 80 and the ground plane 98 are formed of conductive loaded resin-based materials. A layer of insulating material 96 separates the radiating antenna element 64 from the ground plane 98. The radiating antenna element 80 is made up of a first leg 82 and a second leg 84. FIG. 8A shows a top view of the antenna. FIG. 8B shows a cross section of the first leg 82. FIG. 8C shows a cross section of the second leg 84. FIGS. 8B and 8C show the ground plane 98 and the layer of insulating material 96. The cross sectional area of the first leg 82 and the second leg 84 need not be the same. Antennas of this type may be typically built using overmolding technique to join the conductive resin-based material to the insulating material.

Figure 9A:
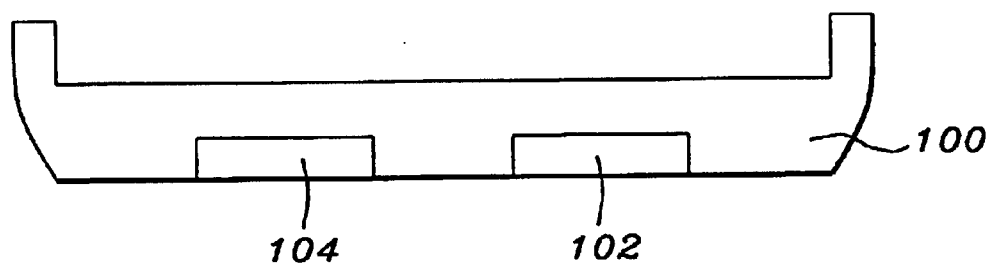
FIG. 9A shows a top view of an antenna formed from a conductive loaded resin-based material embedded in an automobile bumper.
Figure 9B:
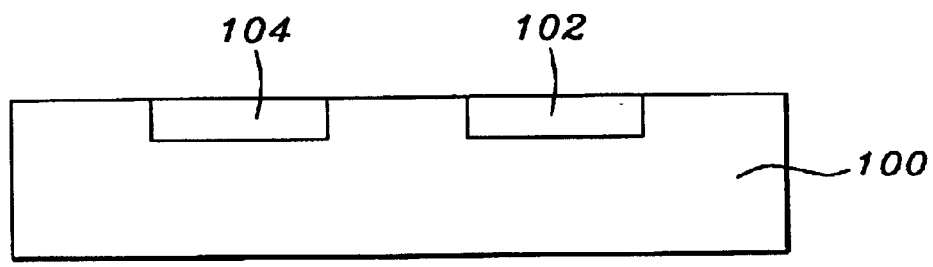
FIG. 9B shows a front view of an antenna formed from a conductive loaded resin-based material embedded in an automobile bumper formed of an insulator such as rubber.

Antennas of this type have a number of uses. FIGS. 9A and 9B show a dipole antenna, formed of conductive loaded resin-based materials, embedded in an automobile bumper 100, formed of insulating material. The dipole antenna has a radiating antenna element 102 and a counterpoise antenna element 104. FIG. 9A shows the top view of the bumper 100 with the embedded antenna. FIG. 9B shows the front view of the bumper 100 with the embedded antenna.

Figure 10A:
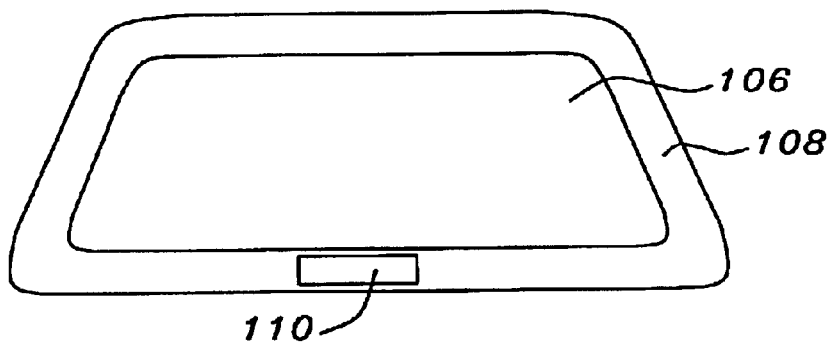
FIG. 10A shows a schematic view of an antenna formed from a conductive loaded resin-based material embedded in the molding of a vehicle window.
Figure 10B:
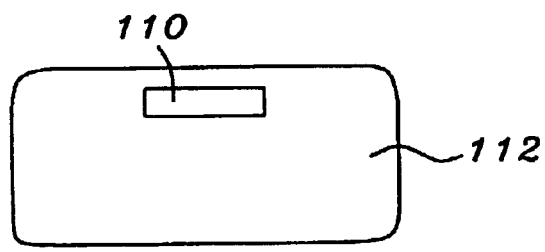
FIG. 10B shows a schematic view of an antenna formed from a conductive loaded resin-based material embedded in the plastic case of a portable electronic device.

The antennas of this invention, formed of conductive loaded resin-based materials, can be used for a number of additional applications. Antennas of this type can be embedded in the molding of a window of a vehicle, such as an automobile or an airplane. FIG. 10A shows a schematic view of such a window 106. The antenna 110 can be embedded in the molding 108. Antennas of this type can be embedded in the plastic housing, or be part of the plastic shell itself, of portable electronic devices such as cellular phones, personal computers, or the like. FIG. 10B shows a schematic view of a segment 112 of such a plastic housing with the antenna 110 embedded in the housing 112.

Figure 11:
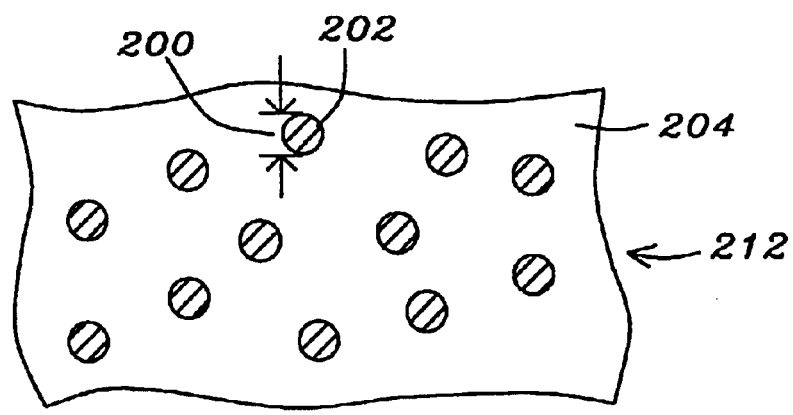
FIG. 11 shows a cross section view of a conductive loaded resin-based material comprising a powder of conductor materials.
Figure 12:
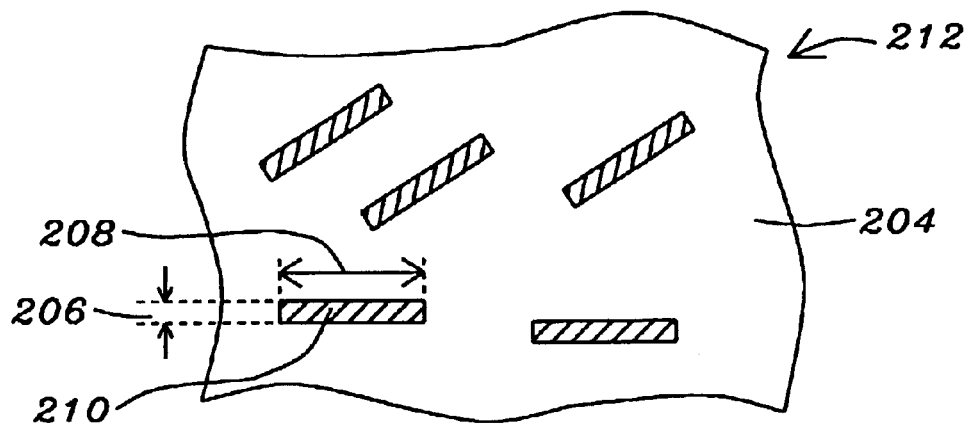
FIG. 12 shows a cross section view of a conductive loaded resin-based material comprising conductor fibers.

The conductive loaded resin-based material typically comprises a powder of conductor particles or a fiber of a conductor material in a resin or plastic host. FIG. 11 shows cross section view of an example of conductor loaded resin-based material 212 having powder of conductor particles 202 in a resin or plastic host 204. In this example the diameter 200 of the of the conductor particles 202 in the powder is between about 3 and 11 microns. FIG. 12 shows a cross section view of an example of conductor loaded resin-based material 212 having conductor fibers 210 in a resin or plastic host 204. In this example the conductor fibers 210 have a diameter of between about 3 and 11 microns and a length of between about 5 and 10 millimeters. The conductors used for these conductor particles 202 or conductor fibers 210 can stainless steel, nickel, copper, silver, or other suitable metals. These conductor particles or fibers are embedded in a resin which in turn is embedded in a plastic host. As previously mentioned, the conductive loaded resin-based materials have a conductivity of between about 5 and 25 ohms per square. To realize this conductivity the ratio of the weight of the conductor material, in this example the conductor particles 202 or conductor fibers 210, to the weight of the resin or plastic host 204 is between about 0.20 and 0.40.

Figure 13:
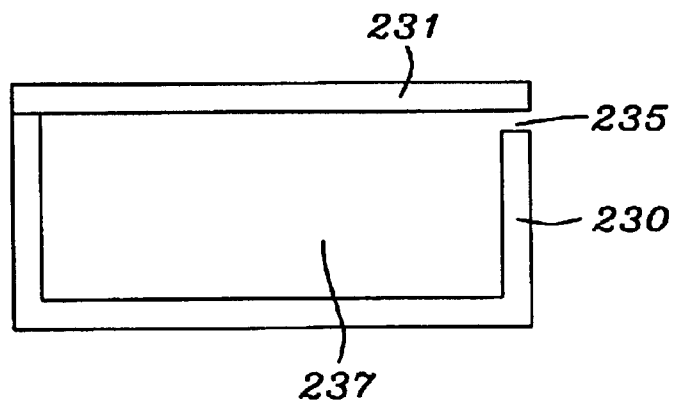
FIG. 13 shows a simplified schematic view of an apparatus for forming injection molded antenna elements.

Antenna elements formed from conductive loaded resin-based materials can be formed in a number of different ways including injection molding or extrusion. FIG. 13 shows a simplified schematic diagram of an injection mold showing a lower portion 230 and upper portion 231 of the mold. Uncured conductive loaded resin-based material is injected into the mold cavity 237 through an injection opening 235 and cured. The upper portion 231 and lower portion 230 of the mold are then separated and the cured antenna element is removed.

Figure 14:
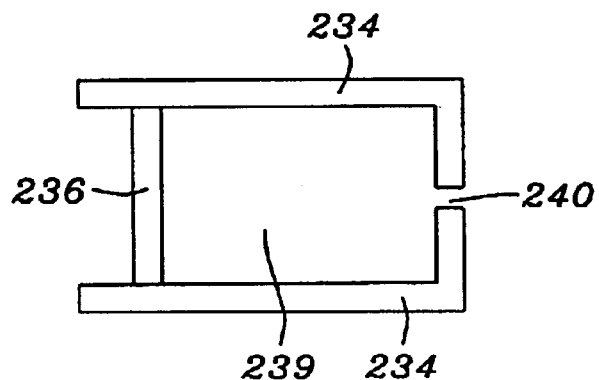
FIG. 14 shows a simplified schematic view of an apparatus for forming extruded antenna elements.

FIG. 14 shows a simplified schematic diagram of an extruder for forming antenna elements using extrusion.

Uncured conductive loaded resin-based material is placed in the cavity 239 of the extrusion unit 234. A piston 236 or other means is then used to force the uncured conductive loaded resin-based material through an extrusion opening 240 which shapes the partially cured conductive loaded resin-based material to the desired shape. The conductive loaded resin-based material is then fully cured and is ready for use.

Figure 15A:
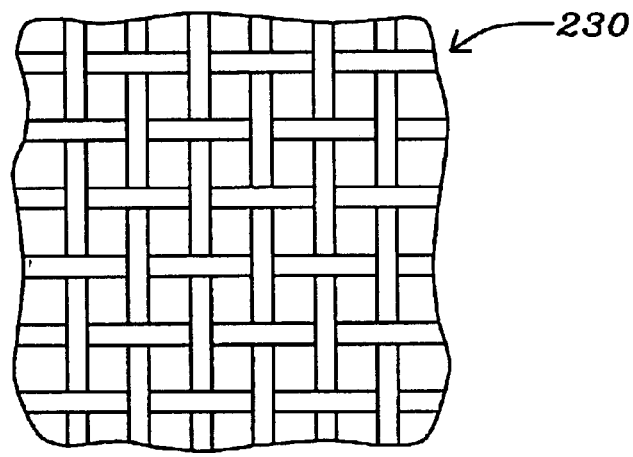
FIG. 15A shows a top view of fibers of conductive loaded resin-based material webbed into a conductive fabric.
Figure 15B:
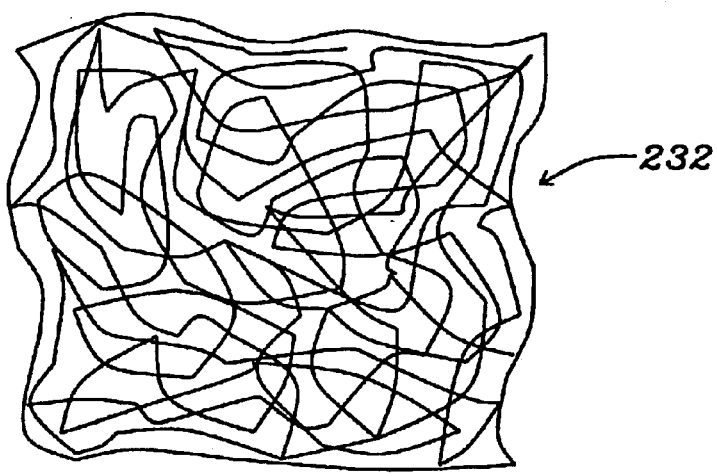
FIG. 15B shows a top view of fibers of conductive loaded resin-based material woven into a conductive fabric.

The conductive loaded resin based material can be formed into fibers which are woven or webbed into a conductive fabric. FIG. 15A shows a webbed conductive fabric 230. FIG. 15B shows a webbed conductive fabric 232. This conductive fabric, 230 and/or 232, can be very thin and cut into desired shapes to form antenna elements. These antenna elements can take the shape of a host and attached as desired.

Antennas formed from the conductive loaded resin-based materials can be designed to work at frequencies from about 2 Kilohertz to about 300 Gigahertz.

While the invention has been particularly shown and described with reference to the preferred embodiments thereof, it will be understood by those skilled in the art that various changes in form and details may be made without departing from the spirit and scope of the invention.

What is claimed is:

1. An antenna comprising:
   a number of antenna elements formed of a conductive loaded resin-based material, wherein said conductive loaded resin-based material comprises conductor fibers in a resin or plastic host and the ratio of the weight of said conductor fibers to the weight of said resin or plastic host is between about 0.20 and 0.40; and
   electrical communication to and among said antenna elements.

2. The antenna of claim 1 further comprising a ground plane.

3. The antenna of claim 2 wherein said ground plane is formed from said conductive loaded resin-based material.

4. The antenna of claim 1 wherein said conductor fibers have a diameter of between about 3 and 11 microns.

5. The antenna of claim 1 wherein said conductor fibers have a length of between 5 and 7 millimeters.

6. The antenna of claim 1 wherein said antenna elements are imbedded in a plastic case for portable electronic equipment.

7. The antenna of claim 1 wherein said antenna elements are imbedded in vehicle window moldings.

8. The antenna of claim 1 wherein the antenna comprising said number of antenna elements is designed for frequencies between about 2 Kilohertz and 300 Gigahertz.

9. The antenna of claim 1 wherein the antenna comprising said number of antenna elements can be a radiating antenna or a receiving antenna.

10. The antenna of claim 1 wherein said conductor fibers are stainless steel, nickel, or copper fibers.

11. An antenna comprising:
    a number of antenna elements formed of a conductive loaded resin-based material, wherein said conductive loaded resin-based material comprises conductor particles in a resin or plastic host and the ratio of the weight of said conductor particles to the weight of said resin or plastic host is between about 0.20 and 0.40; and
    electrical communication to and among said antenna elements.

12. The antenna of claim 11 further comprising a ground plane.

13. The antenna of claim 12 wherein said ground plane is formed from said conductive loaded resin-based material.

14. The antenna of claim 11 wherein said conductor particles have a diameter of between about 3 and 11 microns.

15. The antenna of claim 11 wherein said conductor particles have a spherical shape.

16. The antenna of claim 11 wherein said antenna elements are imbedded in a plastic case for portable electronic equipment.

17. The antenna of claim 11 wherein said antenna elements are imbedded in vehicle window moldings.

18. The antenna of claim 11 wherein the antenna comprising said number of antenna elements is designed for frequencies between about 2 Kilohertz and 300 Gigahertz.

19. The antenna of claim 11 wherein the antenna comprising said number of antenna elements can be a radiating antenna or a receiving antenna.

20. The antenna of claim 11 wherein said conductor particles are stainless steel, nickel, or copper particles.

21. A method of forming an antenna, comprising:
    providing a conductive loaded resin-based material wherein said conductive loaded resin-based material comprises conductor elements in a resin or plastic host and the ratio of the weight of said conductor elements to the weight of said resin or plastic host is between about 0.20 and 0.40;
    forming a number of antenna elements from said conductive loaded resin-based material; and
    forming electrical connections to and among said antenna elements.

22. The method of claim 21 wherein said antenna elements are formed using injection molding of said conductive loaded resin-based material.

23. The method of claim 21 wherein said antenna elements are formed using extrusion of said conductive loaded resin-based material.

24. The method of claim 21 wherein said antenna elements are formed from a flexible conductive fabric formed from said conductive loaded resin-based material.

25. The method of claim 21 wherein said conductor elements are conductor fibers.

26. The method of claim 25 wherein said conductor fibers have a diameter of between about 3 and 11 microns and a length of between about 5 and 7 millimeters.

27. The method of claim 21 wherein said conductor elements are conductor particles.

28. The method of claim 27 wherein said conductor particles have a diameter of between about 3 and 11 microns.

29. The method of claim 21 wherein said conductor elements have a spherical shape and a diameter of between about 3 and 11 microns.

30. The method of claim 21 wherein said conductor elements are formed from stainless steel, nickel, or copper.

* * * * *